United States Patent
Nakahara

(10) Patent No.: US 8,116,052 B2
(45) Date of Patent: Feb. 14, 2012

(54) POWER SUPPLY CONTROL CIRCUIT INCLUDING OVERVOLTAGE PROTECTION CIRCUIT

(75) Inventor: Akihiro Nakahara, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 202 days.

(21) Appl. No.: 12/289,453

(22) Filed: Oct. 28, 2008

(65) Prior Publication Data

US 2009/0128973 A1 May 21, 2009

(30) Foreign Application Priority Data

Nov. 20, 2007 (JP) ................................. 2007-300069

(51) Int. Cl.
*H02H 3/20* (2006.01)
(52) U.S. Cl. ....................................................... 361/91.7
(58) Field of Classification Search .................. 361/91.7
See application file for complete search history.

(56) References Cited

U.S. PATENT DOCUMENTS

| | | | | |
|---|---|---|---|---|
| 5,162,966 A * | 11/1992 | Fujihira | ........................ | 257/140 |
| 5,923,513 A * | 7/1999 | Pelly | ................................ | 361/90 |
| 7,129,759 B2 * | 10/2006 | Fukami | ........................ | 327/110 |
| 7,453,308 B2 * | 11/2008 | Tihanyi | ........................ | 327/309 |
| 7,528,645 B2 * | 5/2009 | Scheikl et al. | ................. | 327/513 |
| 7,576,964 B2 * | 8/2009 | Nakahara | ..................... | 361/91.1 |
| 2005/0052168 A1 * | 3/2005 | Tazawa et al. | ................. | 323/282 |
| 2005/0184710 A1 * | 8/2005 | Souma | .......................... | 323/276 |
| 2007/0014064 A1 | 1/2007 | Souma | | |
| 2007/0145411 A1 * | 6/2007 | Chen et al. | ..................... | 257/173 |

FOREIGN PATENT DOCUMENTS

JP 2007-28747 2/2007

* cited by examiner

*Primary Examiner* — Rexford Barnie
*Assistant Examiner* — Ann Hoang
(74) *Attorney, Agent, or Firm* — McGinn Intellectual Property Law Group, PLLC

(57) ABSTRACT

A protection ability of a power supply control circuit is improved so as to protect an output transistor against a back electromotive voltage from a load, a dump surge voltage, and a positive spike surge voltage which has a smaller energy but is higher than the dump surge voltage. The power supply control circuit includes: an output MOS transistor (power semiconductor device) connected between a first power supply terminal and an output terminal; a load connected to the output terminal; a first dynamic clamping circuit for controlling a voltage difference between a first power supply line and the output terminal; and a first switch connected between the first dynamic clamping circuit and the output MOS transistor, in which a conductive state is determined according to a result of comparison between a reference voltage and a voltage at the output terminal. The power supply control circuit further includes a second dynamic clamping circuit for controlling a voltage difference between the first power supply terminal and the output terminal to protect the output MOS transistor. The second dynamic clamping circuit operates in response to application of a positive spike surge voltage which is higher than the dump surge voltage.

20 Claims, 6 Drawing Sheets

POWER SUPPLY CONTROL CIRCUIT INCLUDING OVERVOLTAGE PROTECTION CIRCUIT

CROSS-REFERENCE TO RELATED APPLICATION

This application is based upon, claims the benefit of priority of, and incorporates by reference the contents of Japanese Patent Application No. 2007-300069 filed on Nov. 20, 2007.

BACKGROUND OF THE INVENTION

1. Field of the Invention

The present invention relates to a power supply control circuit, and more particularly, to a power supply control circuit including an overvoltage protection circuit for protecting from an overvoltage an output transistor for controlling power supply to a load.

2. Description of Related Art

Japanese Unexamined Patent Application Publication No. 2007-28747 (JP 2007-28747A) and its equivalent US Patent Application Publication No. 2007/0014064 A1 disclose an exemplary power supply control circuit including an overvoltage protection circuit for protecting a power semiconductor device. A structure of the power supply control circuit will be described with reference to FIG. 1.

A conventional power supply control circuit 100 includes a gate charge discharging circuit 108, a gate resistance 107, an output MOS transistor (power semiconductor device) 109, a clamp selection switch 110, a dynamic clamping circuit 111, and a load 112. Connection in the power supply control circuit 100 will be described in the following in detail.

The output MOS transistor 109 includes, for example, an N-channel metal-oxide semiconductor field-effect transistor (MOSFET). A first terminal (for example, a drain) of the output MOS transistor 109 is connected to a first power supply line 101a which is in turn connected to a first power supply terminal 101 (for example, at a battery power supply potential), while a second terminal (for example, a source) of the output MOS transistor 109 is connected to a second power supply line 102a via the load 112. The second power supply line 102a is connected to a second power supply terminal 102 (for example, at a ground potential). An output terminal 106 is connected to a node between the output MOS transistor 109 and the load 112. One end of the gate resistance 107 is connected to a control terminal (for example, a gate) of the output MOS transistor 109. A first control signal 104 is input to the other end of the gate resistance 107. Further, the gate charge discharging circuit 108 is connected between the other end of the gate resistance 107 and the output terminal 106. The gate charge discharging circuit 108 is, for example, one MOS transistor. A drain of the gate charge discharging circuit 108 is connected to the other end of the gate resistance 107 while a source of the gate charge discharging circuit 108 is connected to the output terminal 106. A second control signal 105 is input to a gate of the gate charge discharging circuit 108.

The clamp selection switch 110 and the dynamic clamping circuit 111 are connected in series between the gate of the output MOS transistor 109 and the first power supply line 101a. In the power supply control circuit 100, the clamp selection switch 110 is one N-channel MOS transistor, and the dynamic clamping circuit 111 is one zener diode.

A source of the clamp selection switch 110 is connected to the gate of the output MOS transistor 109, a drain of the clamp selection switch 110 is connected to an anode of the dynamic clamping circuit 111, and a control terminal (for example, a gate) of the clamp selection switch 110 is connected to a reference voltage (for example, the ground potential) 103. Further, in the prior art, a substrate bias terminal of the clamp selection switch 110 is connected to the output terminal 106. A cathode of the dynamic clamping circuit 111 is connected to the first power supply line 101a.

The clamp selection switch 110 is a switch between a conductive state and a non-conductive state based on the result of a comparison between two voltages. For example, the clamp selection switch 110 is a switch which is in the conductive state when the reference voltage 103 and a gate voltage of the output MOS transistor 109 are compared and a difference between the two voltages is larger than a threshold voltage of the MOS transistor as the clamp selection switch 110.

The dynamic clamping circuit 111 is a circuit which, when a voltage difference between the anode and the cathode is larger than a breakdown voltage of the diode, controls the voltage difference between the anode and the cathode to a predetermined voltage (for example, a dynamic clamping voltage) or lower.

The load 112 includes an inductive element such as a solenoid and/or a wire harness connected to the output terminal 106.

Operation of the power supply control circuit 100 is now described in detail. Here, the power supply control circuit 100 has three modes: a conductive mode in which the output MOS transistor 109 is in the conductive state and the load 112 generates a voltage at the output terminal 106; a negative voltage surge mode in which, when the output MOS transistor 109 is turned off and is in the non-conductive state, a negative surge voltage is generated at the output terminal 106; and a dump surge mode in which a positive surge voltage named as a dump surge voltage is generated in the first power supply line 101a because a battery terminal is disconnected while an alternator generates electricity. It is to be noted that the energy of the positive surge voltage as a dump surge is relatively large, and thus, it is necessary to prevent the output transistor from being destroyed by the surge. In the following, operation of the power supply control circuit 100 will be described in the respective three modes.

First, in the conductive mode, when the first control signal 104 is at high level, the output MOS transistor 109 is in the conductive state. High level of the first control signal 104 is, for example, a voltage obtained by boosting the battery power supply voltage in order to make the output MOS transistor 109 in the conductive state with a low channel resistance. This generates a voltage at the load 112, and the voltage is output from the output terminal 106. In this case, the gate charge discharging circuit 108 is controlled by the second control signal 105 having the phase reversed to that of the first control signal 104. A low level of the second control signal 105 is, for example, the ground potential. When the second control signal 105 is at low level, the gate charge discharging circuit 108 is in the non-conductive state.

Here, in the conductive mode, because the gate voltage of the clamp selection switch 110 is the ground potential, the clamp selection switch 110 is, regardless of the value of the gate voltage of the output MOS transistor 109, in the non-conductive state. Therefore, the gate of the output MOS transistor 109 and the dynamic clamping circuit 111 are disconnected and current does not flow from the gate of the output MOS transistor 109 to the first power supply line 101a. In other words, the clamp selection switch 110 also has a function to prevent backflow of current from the gate of the output MOS transistor 109 to the first power supply line 101a.

Next, operation in the negative voltage surge mode will be described. A negative surge voltage is generated when the output MOS transistor 109 is turned off and is in the non-conductive state. In this case, the first control signal 104 is at low level while the second control signal 105 is at high level. Here, low level of the first control signal 104 is, for example, the ground potential, and high level of the second control signal 105 is the battery power supply voltage.

When the second control signal 105 is at high level, the gate charge discharging circuit 108 is in the conductive state. Therefore, the gate charge of the output MOS transistor 109 is discharged via the gate resistance 107 and the gate charge discharging circuit 108. Here, the output MOS transistor 109 is made to be in the non-conductive state, and thus, an inductive element of the load 112 generates the negative surge voltage. Here, the clamp selection switch 110 is electrically connected to the output terminal 106 via the gate resistance 107 and the gate charge discharging circuit 108. Because the output MOS transistor 109 is in the non-conductive state, the inductive element of the load 112 generates the negative surge voltage as illustrated in FIG. 2.

Generation of the negative voltage drops the voltage at the output terminal 106. Here, the gate charge discharging circuit 108 is in the conductive state. Therefore, the voltage at the output terminal 106 and the gate voltage of the output MOS transistor 109 are substantially the same, and, according to the voltage drop of the output terminal 106, the gate voltage of the output MOS transistor 109 also drops. When the potential difference between the gate voltage of the clamp selection switch 110 and the gate voltage of the output MOS transistor 109 becomes larger than the threshold voltage of the clamp selection switch 110, the clamp selection switch 110 is made to be in the conductive state. When, after that, the gate voltage of the output MOS transistor 109 further drops and the potential difference across the dynamic clamping circuit 111 becomes equal to or larger than the breakdown voltage of the dynamic clamping circuit 111, a dynamic clamping voltage is generated across the dynamic clamping circuit 111. Further, the output MOS transistor 109 is made to be in the conductive state. This makes the voltage between the drain and the gate of the output MOS transistor 109 controlled by the dynamic clamping voltage. Further, the voltage between the drain and the source of the output MOS transistor 109 is controlled by a voltage value which is the sum of the dynamic clamping voltage and the threshold voltage of the output MOS transistor 109.

In this case, because the output MOS transistor 109 is in the conductive state, current determined by a resistive element of the load flows between the drain and the source of the output MOS transistor 109. In other words, power consumption of the output MOS transistor 109 is equal to the product of the dynamic clamping voltage and the current value determined by the resistive element of the load. The resistive element of the load is set such that thermal destruction of the output MOS transistor 109 by the power consumption does not occur. Further, current determined by dividing the threshold voltage of the output MOS transistor 109 by the resistance value of the gate resistance 107 flows through the dynamic clamping circuit 111. The current is, for example, approximately several tens of microamperes.

Next, operation in the dump surge mode will be described. A dump surge as illustrated in FIG. 3 is applied to the first power supply line 101a and the voltage at the first power supply line 101a is raised. In this case, the gate voltage of the clamp selection switch 110 is the ground potential, and the output terminal 106 is at a positive voltage, and thus, the clamp selection switch 110 is in the non-conductive state. In other words, the gate of the output MOS transistor 109 and the first power supply line 101a are disconnected. Therefore, the gate voltage of the output MOS transistor 109 is not affected by voltage fluctuations of the first power supply line 101a. More specifically, the output MOS transistor 109 is in the non-conductive state when the second control signal 105 is at high level.

In this way, the output MOS transistor 109 is in the non-conductive state and the voltage between the source and the drain is the dump surge voltage. Here, because the breakdown voltage between the drain and the gate and the breakdown voltage between the drain and the source of the output MOS transistor 109 are generally designed so as to be higher than the dump surge voltage, the output MOS transistor 109 is not destroyed by the dump surge.

As described above, in the conventional power supply control circuit 100, by making the clamp selection switch 110 in the conductive state according to change in the output terminal 106 in the negative voltage surge mode, the dynamic clamping circuit 111 is operated to protect the output MOS transistor 109 from the negative surge voltage. In the conductive mode and the dump surge mode, because the output terminal 106 does not generate a negative voltage, the clamp selection switch 110 is in the non-conductive state and the dynamic clamping circuit 111 is inoperative. In other words, the power supply control circuit 100 is a circuit which, when the voltage at the output terminal 106 is a negative voltage, protects the output MOS transistor 109 using the dynamic clamping circuit 111, and, in other modes, prevents destruction not by using the dynamic clamping circuit 111 but by the breakdown voltage of the output MOS transistor 109.

Such a power supply control circuit including an overvoltage protection circuit is extensively used as a power switch for automotive electrical components. Meanwhile, the present inventor seeks to further improve the reliability taking the usage environment into consideration, and seeks to protect the output transistor even from a surge which is higher than the dump surge voltage but has a smaller energy (hereinafter, referred to as positive spike surge voltage). Such a positive spike surge voltage has a voltage waveform as illustrated in FIG. 4.

The present inventor noticed that the power supply control circuit 100 illustrated in FIG. 1 is ineffective against such a positive spike surge voltage and the output MOS transistor 109 is broken down to be destroyed. Because the dynamic clamping circuit 111 is adapted to be inoperative in relation to the dump surge (see FIG. 3) generated at the first power supply terminal 101, when an overvoltage higher than the dump surge is applied as the positive spike surge voltage, if the voltage is equal to or higher than the breakdown voltage of the output MOS transistor 109, the output MOS transistor 109 is destroyed.

SUMMARY

According to one feature of the present invention, a power supply control circuit includes a first overvoltage protection circuit which is operative in relation to a back electromotive voltage generated at an output terminal and is inoperative in relation to a dump surge voltage (a first surge voltage), and a second overvoltage protection circuit which is operative in relation to a positive spike surge voltage (a second surge voltage) that is higher than the dump surge voltage.

Specifically, the first overvoltage protection circuit having a first clamping circuit and a first switch is provided between a power supply line and a control terminal (an electrode) of an output transistor (a power semiconductor device), and the second overvoltage protection circuit having a second clamping circuit is provided between the power supply line and the control terminal (the electrode) of the output transistor. Here, the second clamping circuit may be connected to the power supply line via at least a part of the first clamping circuit.

The first overvoltage protection circuit protects an output MOS transistor from an overvoltage in relation to the back electromotive voltage generated at the output terminal. Meanwhile, in relation to the dump surge voltage having a large energy, which is generated at the power supply line, if the first overvoltage protection circuit is operative, the output MOS transistor is destroyed, and thus, the first switch is in a non-conductive state and the first overvoltage protection circuit is in an inactive state. On the other hand, when the positive spike surge voltage higher than the dump surge voltage (but having a smaller energy) is applied to the power supply line, the first overvoltage protection circuit remains inoperative while the second overvoltage protection circuit is operative in relation to a voltage higher than the back electromotive voltage and the dump surge voltage, and thus, the output transistor is made to be in a conductive state and the output transistor itself is adapted to absorb the positive spike surge voltage. Here, because the positive spike surge voltage has a small energy, the positive spike surge voltage does not destroy the output transistor.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

Figure 1:
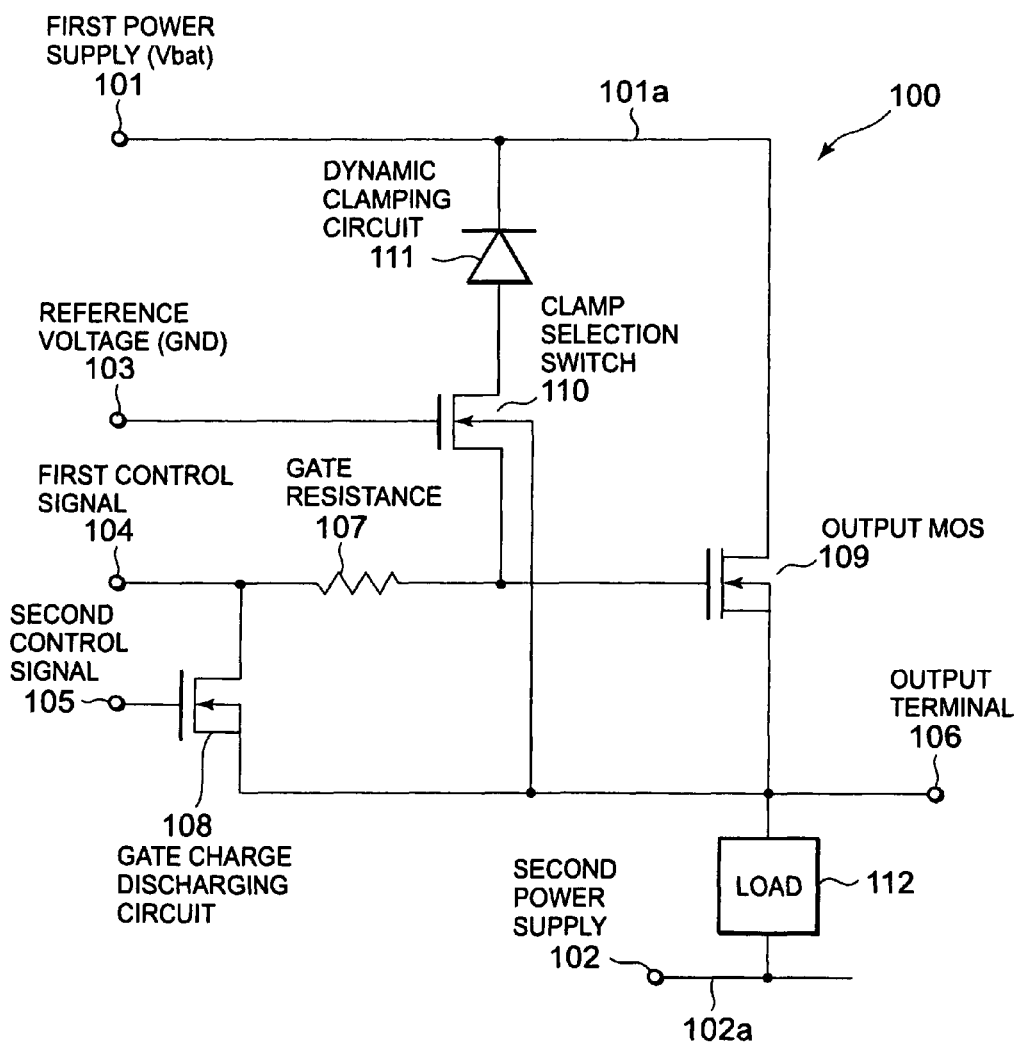
FIG. 1 is a circuit diagram of a conventional power supply control circuit 100.
Figure 2:
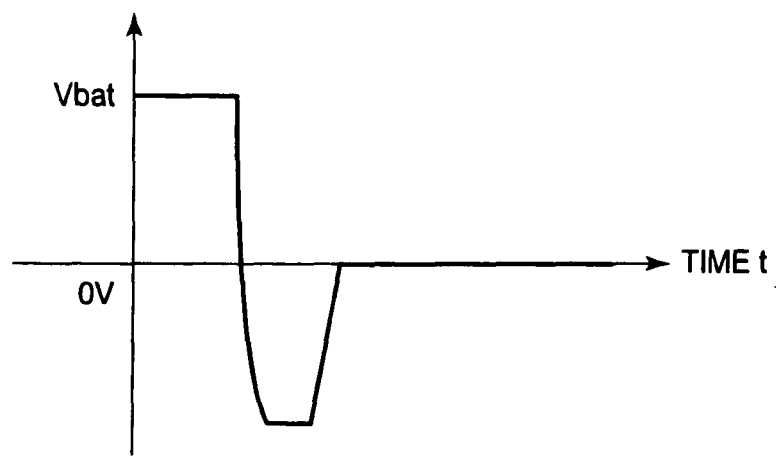
FIG. 2 is a voltage waveform diagram of a negative surge voltage (back electromotive voltage)

The invention will now be described herein with reference to illustrative embodiments. Those skilled in the art will recognize that many alternative embodiments can be accomplished using the teachings of the present invention and that the invention is not limited to the embodiments illustrated for explanatory purposes.

First, a power supply control circuit 201 according to a first embodiment of the present invention will be described in detail with reference to FIG. 5.

The power supply control circuit 201 includes a gate charge discharging circuit 108, a gate resistance 107, an output MOS transistor (power semiconductor device) 109, a first switch (clamp selection switch) 110, a first dynamic clamping circuit 111, a second dynamic clamping circuit 114, a diode 116, a second switch 113, a pull-down device 115, and a load 112.

Connection in the power supply control circuit 201 will be described in the following in detail.

A first terminal (for example, a drain) of the N-channel output MOS transistor 109 is connected to a first power supply line 101a which is in turn connected to a first power supply terminal 101 (for example, at a battery power supply potential), while a second terminal (for example, a source) is connected to a second power supply line 102a via a load 112. The second power supply line 102a is connected to a second power supply terminal 102 (for example, at a ground potential). An output terminal 106 is connected to a node between the output MOS transistor 109 and the load 112. One end of the gate resistance 107 is connected to a control terminal (for example, a gate) of the output MOS transistor 109. A first control signal 104 is input to the other end of the gate resistance 107. Further, the gate charge discharging circuit 108 is connected between the other end of the gate resistance 107 and the output terminal 106. The gate charge discharging circuit 108 is, in the power supply control circuit 201, one N-channel MOS transistor. A drain of the gate charge discharging circuit 108 is connected to the other end of the gate resistance 107 while a source of the gate charge discharging circuit 108 is connected to the output terminal 106. A second control signal 105 is input to a gate of the gate charge discharging circuit 108.

The first switch 110 and the first dynamic clamping circuit 111 are connected in series between the gate of the output MOS transistor 109 and the first power supply line 101a. In the power supply control circuit 201, the first switch 110 is one N-channel MOS transistor, and the first dynamic clamping circuit 111 is one zener diode.

A source of the first switch 110 is connected to the gate of the output MOS transistor 109, a drain of the first switch 110 is connected to an anode of the first dynamic clamping circuit 111, and a control terminal (for example, a gate) of the first switch 110 is connected to a reference voltage (for example, the ground potential) 103. Further, in the power supply control circuit 201, a substrate bias terminal of the first switch 110 is connected to the output terminal 106. A cathode of the first dynamic clamping circuit 111 is connected to the first power supply line 101a.

The first switch 110 is a switch between a conductive state and a non-conductive state based on the result of a comparison between two voltages. For example, the first switch 110 is a switch which is in the conductive state when the reference voltage 103 and a gate voltage of the output MOS transistor 109 are compared and a difference between the two voltages is larger than a threshold voltage of the MOS transistor as the first switch 110.

The first dynamic clamping circuit 111 is a circuit which, when a voltage difference between the anode and the cathode is larger than a breakdown voltage of the diode, controls the voltage difference between the anode and the cathode to a predetermined voltage (for example, a first dynamic clamping voltage) or lower. The load 112 includes an inductive element such as a solenoid and/or a wire harness connected to the output terminal 106.

The second switch 113, the second dynamic clamping circuit 114, and the diode 116 are connected in series between the gate of the output MOS transistor 109 and the anode of the first dynamic clamping circuit 111. In the power supply control circuit 201, the second switch 113 is one N-channel MOS transistor, and each of the second dynamic clamping circuit 114 and the diode 116 is one zener diode.

A source of the second switch 113 is connected to the gate of the output MOS transistor 109, a drain of the second switch 113 is connected to an anode of the diode 116, and a control terminal (for example, a gate) of the second switch 113 is connected to a cathode of the diode 116 and also to the output terminal 106 via the pull-down device 115. Further, in the power supply control circuit 201, a substrate bias terminal of the second switch 113 is connected to the output terminal 106. The cathode of the diode 116 is connected to an anode of the second dynamic clamping circuit 114. A cathode of the second dynamic clamping circuit 114 is connected to the anode of the first dynamic clamping circuit 111. In the power supply control circuit 201, the pull-down device 115 is a depletion N-channel MOS transistor, a drain of which is connected to the gate of the second switch 113 and a source and a gate of which are connected to the output terminal 106.

Next, operation of the power supply control circuit 201 will be described in detail. Here, the power supply control circuit 201 has four modes: a conductive mode in which the output MOS transistor 109 is in the conductive state, and the load 112 generates a voltage at the output terminal 106; a negative voltage surge mode in which, when the output MOS transistor 109 is turned off and the output MOS transistor 109 is in the non-conductive state, a negative surge voltage is generated at the output terminal 106; a dump surge mode in which a positive surge voltage named as a dump surge voltage (a first surge voltage) is generated in the first power supply line 101a because a battery terminal is disconnected while an alternator generates electricity; and a positive spike surge mode in which a positive spike surge voltage (a second surge voltage) is generated which is higher than a dump surge voltage but has a smaller energy. Operation of the power supply control circuit 201 will be described in the respective four modes.

Figure 5:
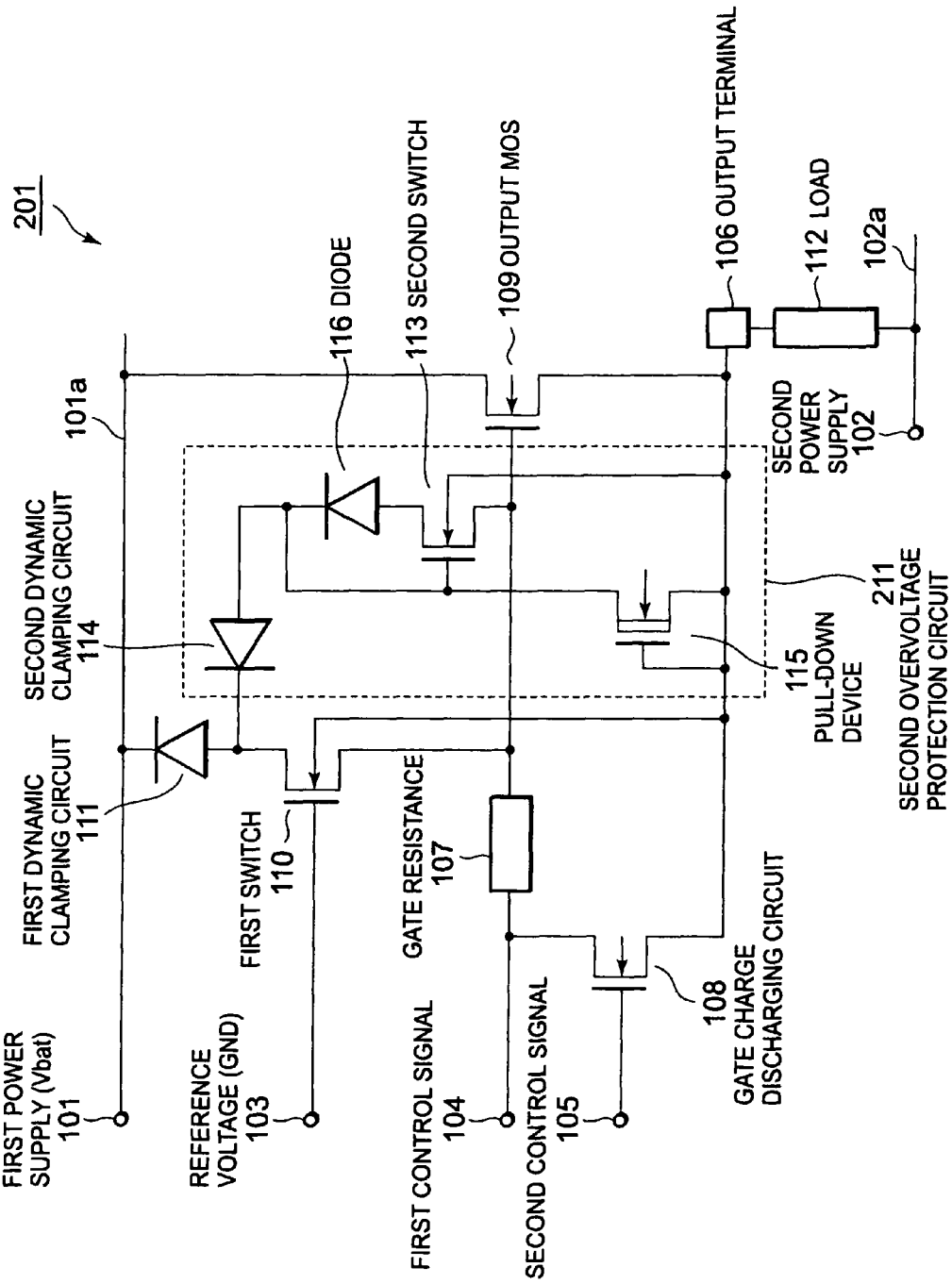
FIG. 5 is a circuit diagram illustrating a power supply control circuit 201 according to a first embodiment of the present invention.

It is to be noted that operation of the portion other than a second overvoltage protection circuit 211 surrounded by a dotted line in FIG. 5 is substantially the same as that of the conventional circuit, and thus, description thereof in detail will be omitted and only a brief description thereof will be made here.

First, in the conductive mode, when the first control signal 104 is at high level, the output MOS transistor 109 is in the conductive state. The high-level first control signal 104 is, for example, a voltage obtained by boosting the battery power supply voltage in order to make the output MOS transistor 109 be in the conductive state with a low channel resistance. This generates a voltage at the load 112, and the voltage is output from the output terminal 106. In this case, the gate charge discharging circuit 108 is controlled by the second control signal 105 the phase of which is opposite to that of the first control signal 104. Low level of the second control signal 105 is, for example, the ground potential. When the second control signal 105 is at low level, the gate charge discharging circuit 108 is in the non-conductive state.

Here, in the conductive mode, because a gate voltage of the second switch 113 is a potential at the output terminal 106 via the pull-down device 115, the second switch 113 is, regardless of the gate voltage of the output MOS transistor 109, in the non-conductive state. Therefore, the gate of the output MOS transistor 109 is disconnected from the second dynamic clamping circuit 114 and the diode 116, and current does not flow from the gate of the output MOS transistor 109 to the first power supply line 101a. In other words, the second switch 113 also has a function to prevent backflow of current from the gate of the output MOS transistor 109 to the first power supply line 101a.

Next, operation in the negative voltage surge mode will be described. A negative surge voltage is generated when the output MOS transistor 109 is turned off and is in the non-conductive state. In this case, the first control signal 104 is at low level while the second control signal 105 is at high level. Here, low level of the first control signal 104 is, for example, the ground potential and high level of the second control signal 105 is the battery power supply voltage.

When the second control signal 105 is at high level, the gate charge discharging circuit 108 is in the conductive state. Therefore, a gate charge of the output MOS transistor 109 is discharged via the gate resistance 107 and the gate charge discharging circuit 108. Here, the output MOS transistor 109 is made to be in the non-conductive state, and thus, an inductive element of the load 112 generates the negative surge voltage.

Here, because the second overvoltage protection circuit 211 is set to be at a clamping voltage which is higher than the voltage at a first overvoltage protection circuit (the circuit includes the first dynamic clamping circuit 111 and the first switch 100), the second switch 113 is in the non-conductive state. Therefore, the gate of the output MOS transistor 109 is disconnected from the second dynamic clamping circuit 114 and the diode 116.

On the other hand, when a potential difference between a gate voltage of the first switch 110 and the gate voltage of the output MOS transistor 109 becomes larger than a threshold voltage of the first switch 110, the first switch 110 is made to be in the conductive state. When, after that, the gate voltage of the output MOS transistor 109 further drops and the potential difference across the first dynamic clamping circuit 111 becomes equal to or larger than a breakdown voltage of the first dynamic clamping circuit 111, a dynamic clamping voltage is generated across the first dynamic clamping circuit 111. Further, the output MOS transistor 109 is made to be in the conductive state. Accordingly, the voltage between the drain and the gate of the output MOS transistor 109 is controlled by a first dynamic clamping voltage. Further, the voltage between the drain and the source of the output MOS transistor 109 is controlled by a voltage which is the sum of the first dynamic clamping voltage and a threshold voltage of the output MOS transistor 109.

Next, operation in the dump surge mode will be described. A dump surge voltage (a first surge voltage) is applied to the first power supply line 101a, and the voltage at the first power supply line 101a is raised. In this case, the gate voltage of the first switch 110 is the ground potential and the output terminal 106 is at a positive voltage, and thus, the first switch 110 is in the non-conductive state. In other words, the gate of the output MOS transistor 109 and the first power supply line 101a are disconnected. Therefore, the gate voltage of the output MOS transistor 109 is not affected by voltage fluctuations of the first power supply line 101a. More specifically, the output MOS transistor 109 is in the non-conductive state when the second control signal 105 is at high level.

In this way, the output MOS transistor 109 is in the non-conductive state, and the voltage between the source and the drain is the dump surge voltage. Here, because the breakdown voltage between the drain and the gate and the breakdown voltage between the drain and the source of the output MOS transistor 109 are generally designed so as to be higher than the dump surge voltage, the output MOS transistor 109 is not destroyed by the dump surge.

As described in the above, in the power supply control circuit 201, by making the first switch 110 be in the conductive state according to change in the output terminal 106 in the negative voltage surge mode, the first dynamic clamping circuit 111 is operated to protect the output MOS transistor 109 from the negative surge voltage. In the conductive mode and the dump surge mode, because the output terminal 106 does not generate a negative voltage, the first switch 110 is in the non-conductive state and the first dynamic clamping circuit 111 is inoperative.

Next, operation in relation to a positive spike surge mode will be described. A positive spike surge voltage (a second surge voltage) which is higher than the dump surge is applied to the first power supply terminal 101, and the voltage at the first power supply line 101a is raised. Here, the state of the first overvoltage protection circuit (the circuit includes the first dynamic clamping circuit 111 and the first switch 110) is the same as that in the dump surge mode. With regard to the second overvoltage protection circuit 211, when the voltage at the first power supply terminal 101 is higher than the sum of the breakdown voltage of the first dynamic clamping circuit 111 and the breakdown voltage of the second dynamic clamping circuit 114, a potential of the control terminal of the second switch 113 becomes higher than a threshold voltage of the second switch 113, and the second switch 113 is made to be in the conductive state. After that, the positive spike surge voltage is further raised. When the positive spike surge voltage becomes higher than the sum of the breakdown voltages of the first dynamic clamping circuit 111, the second dynamic clamping circuit 114, and the diode 116, the dynamic clamping voltage is generated across the first dynamic clamping circuit 111, the second dynamic clamping circuit 114, and the diode 116. This makes the output MOS transistor 109 be in the conductive state, and the voltage between the drain and the source of the output MOS transistor 109 is controlled by the sum of the breakdown voltages of the first dynamic clamping circuit 111, the second dynamic clamping circuit 114, and the diode 116, and the threshold voltage of the output MOS transistor 109. The positive spike surge voltage on the power supply line is absorbed by the conductive output MOS transistor with the voltage between the drain and the source thereof being controlled as described in the above.

Figure 3:
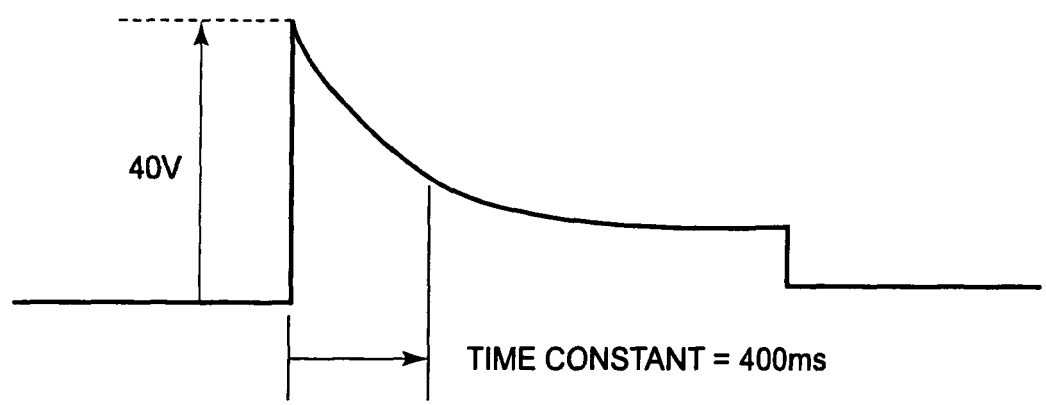
FIG. 3 is a voltage waveform diagram of a dump surge voltage.
Figure 4:
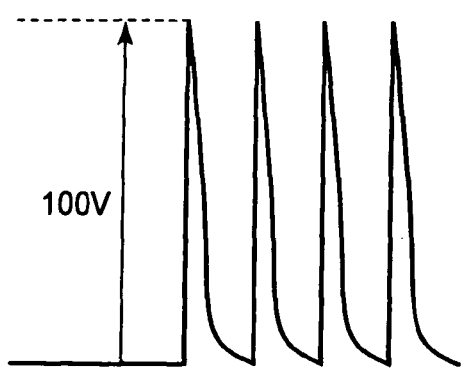
FIG. 4 is a voltage waveform diagram of a positive spike surge voltage.

Typically, the breakdown voltage of the output MOS transistor 109 is designed to be on the order of 60 V when the dump surge voltage is 40 V as shown in FIG. 3. The threshold voltage of the output MOS transistor is on the order of 2.0 V.

The first dynamic clamping circuit 111, the second dynamic clamping circuit 114, and the diode 116 have different breakdown voltages (but their breakdown voltages may be the same). For example, the breakdown voltage of the first dynamic clamping circuit 111 is 18 V, the breakdown voltage of the second dynamic clamping circuit 114 is 25 V, and the breakdown voltage of the diode 116 is 6 V. In this case, in relation to a negative surge voltage, the output MOS transistor 109 is protected from an overvoltage when the negative surge voltage reaches about 20 V (=18 V+2.0 V). In relation to the positive spike surge voltage which is equal to or higher than the dump surge, the output MOS transistor 109 is protected from an overvoltage when the positive spike surge voltage reaches about 51 V (=18 V+25 V+6 V+2.0 V).

In the power supply control circuit 201, the control terminal (for example, the gate) of the second switch 113 is connected to the output terminal 106 via the pull-down device 115. The pull-down device 115 is a depletion MOS transistor, but it may be a resistance.

In the power supply control circuit 201, each of the first dynamic clamping circuit 111, the second dynamic clamping circuit 114, and the diode 116 is one zener diode. It is desirable that a zener diode the breakdown voltage of which is on the order of 6 V be used. The reason is that a zener diode the breakdown voltage of which is on the order of 6 V does not have wide manufacturing variations and has almost no temperature characteristics, and thus, the precision of the overvoltage protection circuit can be satisfactory. In this case, the first dynamic clamping circuit 111 and the second dynamic clamping circuit 114 may be formed by connecting in series a required number of zener diodes.

Figure 6:
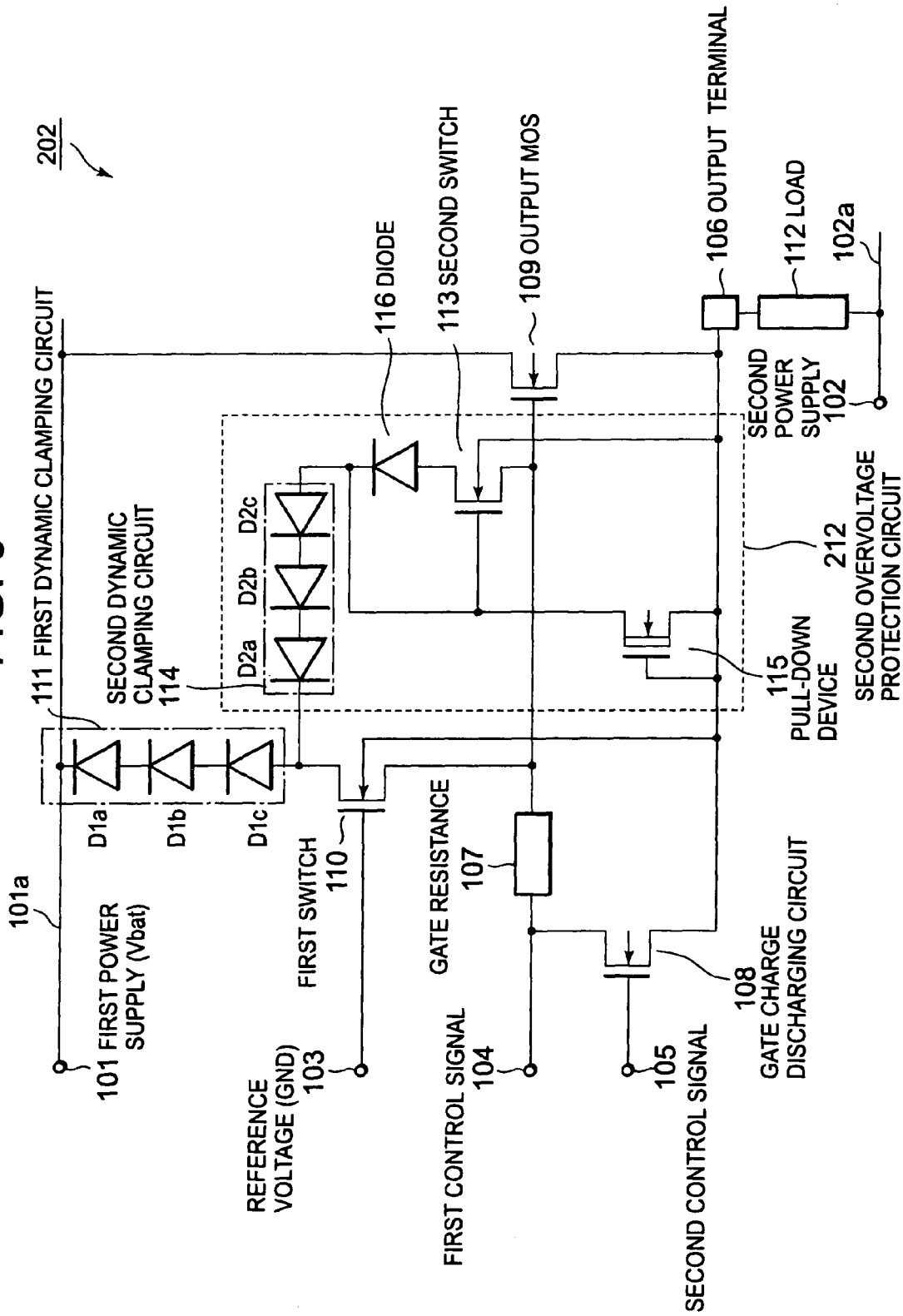
FIG. 6 is a circuit diagram illustrating a power supply control circuit 202 according to a second embodiment of the present invention.

Next, a power supply control circuit 202 according to a second embodiment of the present invention will be described in detail with reference to FIG. 6.

The power supply control circuit 202 includes a gate charge discharging circuit 108, a gate resistance 107, an output MOS transistor 109, a first switch (clamp selection switch) 110, a first dynamic clamping circuit 111, a second dynamic clamping circuit 114, a diode 116, a second switch 113, a pull-down device 115, and a load 112.

Connection in the power supply control circuit 202 will be described in the following in detail.

A first terminal (for example, a drain) of the output MOS transistor 109 is connected to a first power supply line 101a which is in turn connected to a first power supply terminal 101 (for example, at a battery power supply potential), while a second terminal (for example, a source) of the output MOS transistor 109 is connected to a second power supply line 102a via a load 112. The second power supply line 102a is connected to a second power supply terminal 102 (for example, at a ground potential). An output terminal 106 is connected to a node between the output MOS transistor 109 and the load 112. One end of the gate resistance 107 is connected to a control terminal (for example, agate) of the output MOS transistor 109. A first control signal 104 is input to the other end of the gate resistance 107. Further, the gate charge discharging circuit 108 is connected between the other end of the gate resistance 107 and the output terminal 106. The gate charge discharging circuit 108 is, in the power supply control circuit 202, one MOS transistor. A drain of the gate charge discharging circuit 108 is connected to the other end of the gate resistance 107 while a source of the gate charge discharging circuit 108 is connected to the output terminal 106. A second control signal 105 is input to a gate of the gate charge discharging circuit 108.

The first switch 110 and the first dynamic clamping circuit 111 are connected in series between the gate of the output MOS transistor 109 and the first power supply line 101a. In the power supply control circuit 202, the first switch 110 is one MOS transistor, and the first dynamic clamping circuit 111 includes three zener diodes D1a to D1c connected in series.

A source of the first switch 110 is connected to the gate of the output MOS transistor 109, a drain of the first switch 110 is connected to an anode of the first dynamic clamping circuit 111, and a control terminal (for example, a gate) of the first switch 110 is connected to a reference voltage (for example, the ground potential) 103. Further, in the power supply control circuit 202, a substrate bias terminal of the first switch 110 is connected to the output terminal 106. A cathode of the first dynamic clamping circuit 111 is connected to the first power supply line 101a.

The first switch 110 is a switch between a conductive state and a non-conductive state based on the result of a comparison between two voltages. For example, the first switch 110 is a switch which is in the conductive state when the ground potential and a gate voltage of the output MOS transistor 109 are compared and a difference between the two voltages is larger than a threshold voltage of the MOS transistor as the first switch 110.

The first dynamic clamping circuit 111 is a circuit which, when a voltage difference between the anode and the cathode is larger than a breakdown voltage of the diode, controls the voltage difference between the anode and the cathode to a predetermined voltage (for example, a first dynamic clamping voltage) or lower. The load 112 includes an inductive element such as a solenoid and/or a wire harness connected to the output terminal 106.

The second switch 113, the second dynamic clamping circuit 114, and the diode 116 are connected in series between the gate of the output MOS transistor 109 and the anode of the first dynamic clamping circuit 111. In the power supply control circuit 202, the second switch 113 is one MOS transistor, the second dynamic clamping circuit 114 includes three zener diodes D2a to D2c connected in series, and the diode 116 is one zener diode.

A source of the second switch 113 is connected to the gate of the output MOS transistor 109, a drain of the second switch 113 is connected to an anode of the diode 116, and a control terminal (for example, a gate) of the second switch 113 is connected to a cathode of the diode 116 and also to the output terminal 106 via the pull-down device 115. Further, in the power supply control circuit 202, a substrate bias terminal of the second switch 113 is connected to the output terminal 106. The cathode of the diode 116 is connected to an anode of the second dynamic clamping circuit 114. A cathode of the second dynamic clamping circuit 114 is connected to the anode of the first dynamic clamping circuit 111. In the power supply control circuit 202, the pull-down device 115 is a depletion MOS transistor a drain of which is connected to a gate of the second switch 113 and a source and a gate of which are connected to the output terminal 106.

Next, operation of the power supply control circuit 202 will be described in detail. First, in the conductive mode, when the first control signal 104 is at high level, the output MOS transistor 109 is in the conductive state. The high-level first control signal 104 is, for example, a voltage obtained by boosting the battery power supply voltage in order to make the output MOS transistor 109 be in the conductive state with a low channel resistance. This generates a voltage at the load 112, and the voltage is output from the output terminal 106. In this case, the gate charge discharging circuit 108 is controlled by the second control signal 105 the phase of which is opposite to that of the first control signal 104. Low level of the second control signal 105 is, for example, the ground potential. When the second control signal 105 is at low level, the gate charge discharging circuit 108 is in the non-conductive state.

Here, in the conductive mode, because a gate voltage of the second switch 113 is a potential at the output terminal 106 via the pull-down device 115, the second switch 113 is, regardless of the gate voltage of the output MOS transistor 109, in the non-conductive state. Therefore, the gate of the output MOS transistor 109 is disconnected from the second dynamic clamping circuit 114 and the diode 116, and current does not flow from the gate of the output MOS transistor 109 to the first power supply line 101a. In other words, the second switch 113 also has a function to prevent backflow of current from the gate of the output MOS transistor 109 to the first power supply line 101a.

Operation in the negative voltage surge mode will be described. A negative surge voltage is generated when the output MOS transistor 109 is turned off and is in the non-conductive state. In this case, the first control signal 104 is at low level while the second control signal 105 is at high level. Here, low level of the first control signal 104 is, for example, the ground potential and high level of the second control signal 105 is the battery power supply voltage.

When the second control signal 105 is at high level, the gate charge discharging circuit 108 is in the conductive state. Therefore, a gate charge of the output MOS transistor 109 is discharged via the gate resistance 107 and the gate charge discharging circuit 108. Here, the output MOS transistor 109 is made to be in the non-conductive state, and thus, an inductive element of the load 112 generates the negative surge voltage. Here, because a second overvoltage protection circuit 212 is set to be at a clamping voltage which is higher than the voltage at a first overvoltage protection circuit (the circuit includes the first dynamic clamping circuit 111 and the first switch 110), the second switch 113 is in the non-conductive state. Therefore, the gate of the output MOS transistor 109 is disconnected from the second dynamic clamping circuit 114 and the diode 116. On the other hand, when a potential difference between a gate voltage of the first switch 110 and the gate voltage of the output MOS transistor 109 becomes larger than a threshold voltage of the first switch 110, the first switch 110 is made to be in the conductive state. When, after that, the gate voltage of the output MOS transistor 109 further drops and the potential difference across the first dynamic clamping circuit 111 becomes equal to or larger than a breakdown voltage of the first dynamic clamping circuit 111, a dynamic clamping voltage is generated across the first dynamic clamping circuit 111. Further, the output MOS transistor 109 is made to be in the conductive state. Accordingly, the voltage between the drain and the gate of the output MOS transistor 109 is controlled by a first dynamic clamping voltage. Further, the voltage between the drain and the source of the output MOS transistor 109 is controlled by a voltage which is the sum of the first dynamic clamping voltage (the sum of breakdown voltages of D1a to D1c) and a threshold voltage of the output MOS transistor 109.

Next, operation in the dump surge mode will be described. A dump surge voltage (a first surge voltage) is applied to the first power supply line 101a, and the voltage at the first power supply line 101a is raised. In this case, the gate voltage of the first switch 110 is the ground potential and the output terminal 106 is at a positive voltage, and thus, the first switch 110 is in the non-conductive state. In other words, the gate of the output MOS transistor 109 and the first power supply line 101a are disconnected. Therefore, the gate voltage of the output MOS transistor 109 is not affected by voltage fluctuations of the first power supply line 101a. More specifically, the output MOS transistor 109 is in the non-conductive state when the second control signal 105 is at high level.

In this way, the output MOS transistor 109 is in the non-conductive state, and the voltage between the source and the drain is the dump surge voltage. Here, because the breakdown voltage between the drain and the gate and the breakdown voltage between the drain and the source of the output MOS transistor 109 are generally designed so as to be higher than the dump surge voltage, the output MOS transistor 109 is not destroyed by the dump surge.

As described in the above, in the power supply control circuit 202, by making the first switch 110 be in the conductive state according to change in the output terminal 106 in the negative voltage surge mode, the first dynamic clamping circuit 111 is operated to protect the output MOS transistor 109 from the negative surge voltage. In the conductive mode and the dump surge mode, because the output terminal 106 does not generate a negative voltage, the first switch 110 is in the non-conductive state and the first dynamic clamping circuit 111 is inoperative.

Next, operation in relation to a positive spike surge mode will be described. A positive spike surge voltage (a second surge voltage) which is higher than the dump surge is applied to the first power supply terminal 101, and the voltage at the first power supply line 101a is raised. Here, the state of the first overvoltage protection circuit (the circuit includes the first dynamic clamping circuit 111 and the first switch 110) is the same as that in the dump surge mode. With regard to the second overvoltage protection circuit 212, when the voltage at the first power supply terminal 101 is higher than the sum of the breakdown voltage of the first dynamic clamping circuit 111 and the breakdown voltage of the second dynamic clamping circuit 114, a potential of the control terminal of the second switch 113 becomes higher than a threshold voltage of the second switch 113, and the second switch 113 is made to be in the conductive state. After that, the positive spike surge voltage is further raised. When the positive spike surge voltage becomes higher than the sum of the breakdown voltages of the first dynamic clamping circuit 111, the second dynamic clamping circuit 114, and the diode 116, the dynamic clamping voltage is generated across the first dynamic clamping circuit 111, the second dynamic clamping circuit 114, and the diode 116. Accordingly, the voltage between the drain and the source of the output MOS transistor 109 is controlled by the sum of the first dynamic clamping voltage (the sum of the breakdown voltages of D1a to D1c), the second dynamic clamping voltage (the sum of breakdown voltages of D2a to D2c), the breakdown voltage of the diode 116, and the threshold voltage of the output MOS transistor 109.

Figure 7:
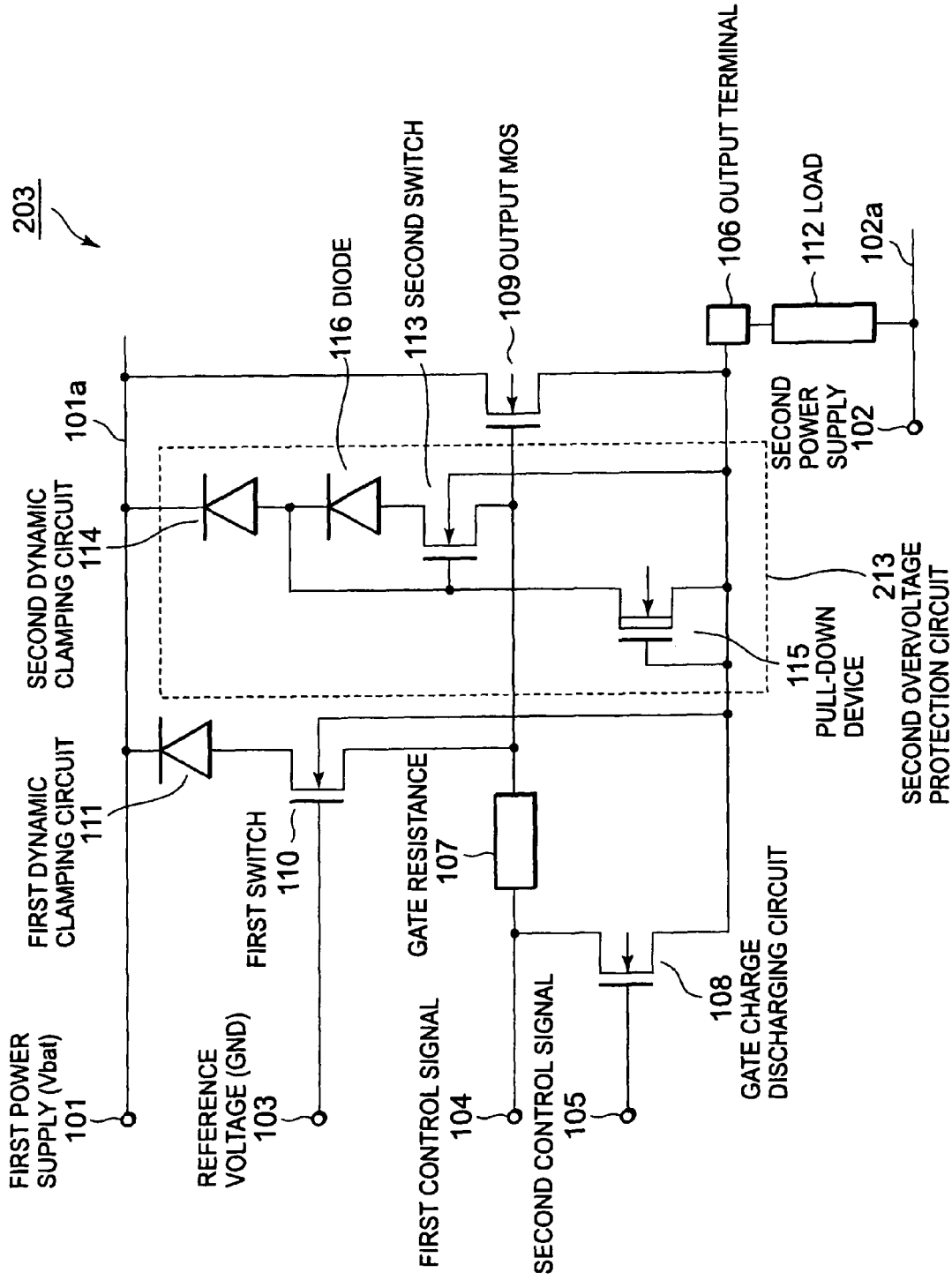
FIG. 7 is a circuit diagram illustrating a power supply control circuit 203 according to a third embodiment of the present invention.

Next, a power supply control circuit 203 according to a third embodiment of the present invention will be described in detail with reference to FIG. 7.

The power supply control circuit 203 includes a gate charge discharging circuit 108, a gate resistance 107, an output MOS transistor 109, a first switch (clamp selection switch) 110, a first dynamic clamping circuit 111, a second dynamic clamping circuit 114, a diode 116, a second switch 113, a pull-down device 115, and a load 112.

Connection in the power supply control circuit 203 will be described in the following in detail.

A first terminal (for example, a drain) of the output MOS transistor 109 is connected to a first power supply line 101a which is in turn connected to a first power supply terminal 101 (for example, at a battery power supply potential), while a second terminal (for example, a source) of the output MOS transistor 109 is connected to a second power supply line 102a via a load 112. The second power supply line 102a is connected to a second power supply terminal 102 (for example, at a ground potential). An output terminal 106 is connected to a node between the output MOS transistor 109 and the load 112. One end of the gate resistance 107 is connected to a control terminal (for example, a gate) of the output MOS transistor 109. A first control signal 104 is input to the other end of the gate resistance 107. Further, the gate charge discharging circuit 108 is connected between the other end of the gate resistance 107 and the output terminal 106. The gate charge discharging circuit 108 is, in the power supply control circuit 203, one MOS transistor. A drain of the gate charge discharging circuit 108 is connected to the other end of the gate resistance 107 while a source of the gate charge discharging circuit 108 is connected to the output terminal 106. A second control signal 105 is input to a gate of the gate charge discharging circuit 108.

The first switch 110 and the first dynamic clamping circuit 111 are connected in series between the gate of the output MOS transistor 109 and the first power supply line 101a. In the power supply control circuit 203, the first switch 110 is one N-channel MOS transistor, and the first dynamic clamping circuit 111 is one zener diode.

A source of the first switch 110 is connected to the gate of the output MOS transistor 109, a drain of the first switch 110 is connected to an anode of the first dynamic clamping circuit 111, and a control terminal (for example, a gate) of the first switch 110 is connected to a reference voltage (for example, the ground potential) 103. Further, in the power supply control circuit 203, a substrate bias terminal of the first switch 110 is connected to the output terminal 106. A cathode of the first dynamic clamping circuit 111 is connected to the first power supply line 101a.

The first switch 110 is a switch between a conductive state and a non-conductive state based on the result of a comparison between two voltages. For example, the first switch 110 is a switch which is in the conductive state when the ground potential and a gate voltage of the output MOS transistor 109 are compared and a difference between the two voltages is larger than a threshold voltage of the MOS transistor as the first switch 110.

The first dynamic clamping circuit 111 is a circuit which, when a voltage difference between the anode and the cathode is larger than a breakdown voltage of the diode, controls the voltage difference between the anode and the cathode to a predetermined voltage (for example, a first dynamic clamping voltage) or lower. The load 112 includes an inductive element such as a solenoid and/or a wire harness connected to the output terminal 106.

The second switch 113, the second dynamic clamping circuit 114, and the diode 116 are connected in series between the gate of the output MOS transistor 109 and the first power supply line 101a. In the power supply control circuit 203, the second switch 113 is one MOS transistor, and each of the second dynamic clamping circuit 114 and the diode 116 is one zener diode. Further, while, in the power supply control circuit 201, the anode of the second dynamic clamping circuit 114 is connected to the node between the first dynamic clamping circuit 111 and the first switch 110, in the power supply control circuit 203, an anode of the second dynamic clamping circuit 114 is connected to the first power supply line 101a.

A source of the second switch 113 is connected to the gate of the output MOS transistor 109, a drain of the second switch 113 is connected to an anode of the diode 116, and a control terminal (for example, a gate) of the second switch 113 is connected to a cathode of the diode 116 and also to the output terminal 106 via the pull-down device 115. Further, in the power supply control circuit 203, a substrate bias terminal of the second switch 113 is connected to the output terminal 106. The cathode of the diode 116 is connected to an anode of the second dynamic clamping circuit 114. A cathode of the second dynamic clamping circuit 114 is connected to the anode of the first dynamic clamping circuit 111. In the power supply control circuit 203, the pull-down device 115 is a depletion MOS transistor a drain of which is connected to a gate of the second switch 113 and a source and a gate of which are connected to the output terminal 106.

As to the circuit operation, first, in the conductive mode, when the first control signal 104 is at high level, the output MOS transistor 109 is in the conductive state. The high-level first control signal 104 is, for example, a voltage obtained by boosting the battery power supply voltage in order to make the output MOS transistor 109 be in the conductive state with a low channel resistance. This generates a voltage at the load 112, and the voltage is output from the output terminal 106. In this case, the gate charge discharging circuit 108 is controlled by the second control signal 105 the phase of which is opposite to that of the first control signal 104. Low level of the second control signal 105 is, for example, the ground potential. When the second control signal 105 is at low level, the gate charge discharging circuit 108 is in the non-conductive state.

Here, in the conductive mode, because a gate voltage of the second switch 113 is a potential at the output terminal 106 via the pull-down device 115, the second switch 113 is, regardless of the gate voltage of the output MOS transistor 109, in the non-conductive state. Therefore, the gate of the output MOS transistor 109 is disconnected from the second dynamic clamping circuit 114 and the diode 116, and current does not flow from the gate of the output MOS transistor 109 to the first power supply line 101a. In other words, the second switch 113 also has a function to prevent backflow of current from the gate of the output MOS transistor 109 to the first power supply line 101a.

Operation in the negative voltage surge mode will be described. A negative surge voltage is generated when the output MOS transistor 109 is turned off and is in the non-conductive state. In this case, the first control signal 104 is at low level while the second control signal 105 is at high level. Here, low level of the first control signal 104 is, for example, the ground potential and high level of the second control signal 105 is the battery power supply voltage.

When the second control signal 105 is at high level, the gate charge discharging circuit 108 is in the conductive state. Therefore, a gate charge of the output MOS transistor 109 is discharged via the gate resistance 107 and the gate charge discharging circuit 108. Here, the output MOS transistor 109 is made to be in the non-conductive state, and thus, an inductive element of the load 112 generates the negative surge voltage. Here, because a second overvoltage protection circuit 213 is set to be at a clamping voltage which is higher than the voltage at a first overvoltage protection circuit (the circuit includes the first dynamic clamping circuit 111 and the first switch 110), the second switch 113 is in the non-conductive state. Therefore, the gate of the output MOS transistor 109 is disconnected from the second dynamic clamping circuit 114 and the diode 116. On the other hand, when a potential difference between a gate voltage of the first switch 110 and the gate voltage of the output MOS transistor 109 becomes larger than a threshold voltage of the first switch 110, the first switch 110 is made to be in the conductive state. When, after that, the gate voltage of the output MOS transistor 109 further drops and the potential difference across the first dynamic clamping circuit 111 becomes equal to or larger than a breakdown voltage of the first dynamic clamping circuit 111, a dynamic clamping voltage is generated across the first dynamic clamping circuit 111. Further, the output MOS transistor 109 is made to be in the conductive state. Accordingly, the voltage between the drain and the gate of the output MOS transistor 109 is controlled by a first dynamic clamping voltage. Further, the voltage between the drain and the source of the output MOS transistor 109 is controlled by a voltage which is the sum of the first dynamic clamping voltage and a threshold voltage of the output MOS transistor 109.

Next, operation in the dump surge mode will be described. A dump surge voltage (a first surge voltage) is applied to the first power supply line 101a, and the voltage at the first power supply line 101a is raised. In this case, the gate voltage of the first switch 110 is the ground potential and the output terminal 106 is at a positive voltage, and thus, the first switch 110 is in the non-conductive state. In other words, the gate of the output MOS transistor 109 and the first power supply line 101a are disconnected. Therefore, the gate voltage of the output MOS transistor 109 is not affected by voltage fluctuations of the first power supply line 101a. More specifically, the output MOS transistor 109 is in the non-conductive state when the second control signal 105 is at high level.

In this way, the output MOS transistor 109 is in the non-conductive state, and the voltage between the source and the drain is the dump surge voltage. Here, because the breakdown voltage between the drain and the gate and the breakdown voltage between the drain and the source of the output MOS transistor 109 are generally designed so as to be higher than the dump surge voltage, the output MOS transistor 109 is not destroyed by the dump surge.

As described in the above, in the power supply control circuit 203, by making the first switch 110 be in the conductive state according to change in the output terminal 106 in the negative voltage surge mode, the first dynamic clamping circuit 111 is operated to protect the output MOS transistor 109 from the negative surge voltage. In the conductive mode and the dump surge mode, because the output terminal 106 does not generate a negative voltage, the first switch 110 is in the non-conductive state and the first dynamic clamping circuit 111 is inoperative.

Next, operation in relation to a positive spike surge mode will be described. A positive spike surge voltage (a second surge voltage) which is higher than the dump surge is applied to the first power supply terminal 101, and the voltage at the first power supply line 101a is raised. Here, the state of the first overvoltage protection circuit (the circuit includes the first dynamic clamping circuit 111 and the first switch 110) is the same as that in the dump surge mode. With regard to the second overvoltage protection circuit 213, when the voltage at the first power supply terminal 101 is higher than the breakdown voltage of the second dynamic clamping circuit 114, a potential of the control terminal of the second switch 113 becomes higher than a threshold voltage of the second switch 113, and the second switch 113 is made to be in the conductive state. After that, the positive spike surge voltage is further raised. When the positive spike surge voltage becomes higher than the sum of the breakdown voltages of the second dynamic clamping circuit 114 and the diode 116, the dynamic clamping voltage is generated across the second dynamic clamping circuit 114 and the diode 116. Accordingly, the voltage between the drain and the source of the output MOS transistor 109 is controlled by the sum of the breakdown voltages of the second dynamic clamping circuit 114 and the diode 116, and the threshold voltage of the output MOS transistor 109.

Next, a power supply control circuit 204 according to a fourth embodiment of the present invention will be described in detail with reference to FIG. 8.

Figure 8:
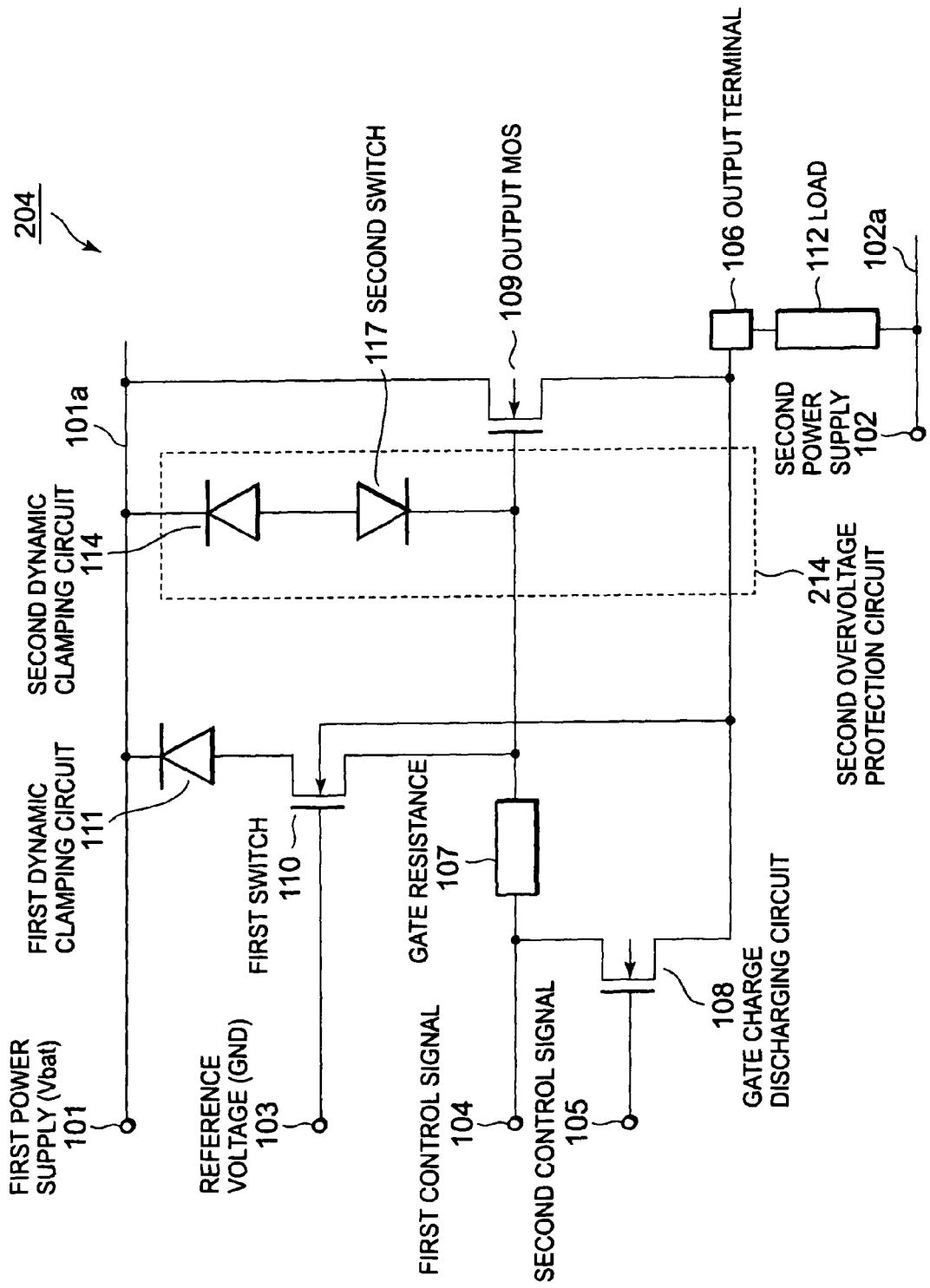
FIG. 8 is a circuit diagram illustrating a power supply control circuit 204 according to a fourth embodiment of the present invention.

Although, in the above-mentioned power supply control circuits 201 to 203, electrical connection and disconnection of the second dynamic clamping circuit 114 are made by the second switch 113, the diode 116, and the pull-down device 115, a diode 117 may have the function as in the power supply control circuit 204 illustrated in FIG. 8.

The power supply control circuit 204 includes a gate charge discharging circuit 108, a gate resistance 107, an output MOS transistor 109, a first switch (clamp selection switch) 110, a first dynamic clamping circuit 111, a second dynamic clamping circuit 114, a second diode 117, and a load 112.

Connection in the power supply control circuit 204 will be described in the following in detail.

A first terminal (for example, a drain) of the output MOS transistor 109 is connected to a first power supply terminal 101 (for example, at a battery power supply potential), while a second terminal (for example, a source) of the output MOS transistor 109 is connected to a second power supply line 102a via a load 112. The second power supply line 102a is connected to a second power supply terminal 102 (for example, at a ground potential). An output terminal 106 is connected to a node between the output MOS transistor 109 and the load 112. One end of the gate resistance 107 is connected to a control terminal (for example, a gate) of the output MOS transistor 109. A first control signal 104 is input to the other end of the gate resistance 107. Further, the gate charge discharging circuit 108 is connected between the other end of the gate resistance 107 and the output terminal 106. The gate charge discharging circuit 108 is, in the power supply control circuit 204, one MOS transistor. A drain of the gate charge discharging circuit 108 is connected to the other end of the gate resistance 107 while a source of the gate charge discharging circuit 108 is connected to the output terminal 106. A second control signal 105 is input to a gate of the gate charge discharging circuit 108.

The first switch 110 and the first dynamic clamping circuit 111 are connected in series between the gate of the output MOS transistor 109 and a first power supply line 101a. In the power supply control circuit 204, the first switch 110 is one MOS transistor, and the first dynamic clamping circuit 111 is one zener diode.

A source of the first switch 110 is connected to the gate of the output MOS transistor 109, a drain of the first switch 110 is connected to an anode of the first dynamic clamping circuit 111, and a control terminal (for example, a gate) of the first switch 110 is connected to a reference voltage (for example, the ground potential) 103. Further, in the power supply control circuit 204, a substrate bias terminal of the first switch 110 is connected to the output terminal 106. A cathode of the first dynamic clamping circuit 111 is connected to the first power supply line 101a.

The first switch 110 is a switch between a conductive state and a non-conductive state based on the result of a comparison between two voltages. For example, the first switch 110 is a switch which is in the conductive state when the ground potential and a gate voltage of the output MOS transistor 109 are compared and a difference between the two voltages is larger than a threshold voltage of the MOS transistor as the first switch 110.

The first dynamic clamping circuit 111 is a circuit which, when a voltage difference between the anode and the cathode is larger than a breakdown voltage of the diode, controls the voltage difference between the anode and the cathode to a predetermined voltage (for example, a first dynamic clamping voltage) or lower. The load 112 includes an inductive element such as a solenoid and/or a wire harness connected to the output terminal 106.

The second diode 117 and the second dynamic clamping circuit 114 are connected in series between the gate of the output MOS transistor 109 and the first power supply line 101a. In the power supply control circuit 204, the second diode 117 is one diode. It is desirable that, when the power supply control circuit 204 is integrated into one semiconductor chip, the second diode 117 be a diode formed of polysilicon.

A cathode of the second diode 117 is connected to the gate of the output MOS transistor 109 and an anode of the second diode 117 is connected to an anode of the second dynamic clamping circuit 114.

In the conductive mode, when the first control signal 104 is at high level, the output MOS transistor 109 is in the conductive state. The high-level first control signal 104 is, for example, a voltage obtained by boosting the battery power supply voltage in order to make the output MOS transistor 109 be in the conductive state with a low channel resistance. This generates a voltage at the load 112, and the voltage is output from the output terminal 106. In this case, the gate charge discharging circuit 108 is controlled by the second control signal 105 the phase of which is opposite to that of the first control signal 104. Low level of the second control signal 105 is, for example, the ground potential. When the second control signal 105 is at low level, the gate charge discharging circuit 108 is in the non-conductive state.

Here, in the conductive mode, because a potential of the cathode of the second diode 117 is higher than a potential of the anode of the second diode 117, the second diode 117 is in the non-conductive state. Therefore, the gate of the output MOS transistor 109 and the second dynamic clamping circuit 114 are disconnected, and current does not flow from the gate of the output MOS transistor 109 to the first power supply line 101a. In other words, the second diode 117 also has a function to prevent backflow of current from the gate of the output MOS transistor 109 to the first power supply line 101a.

Operation in the negative voltage surge mode will be described. A negative surge voltage is generated when the output MOS transistor 109 is turned off and is in the non-conductive state. In this case, the first control signal 104 is at low level while the second control signal 105 is at high level. Here, low level of the first control signal 104 is, for example, the ground potential and high level of the second control signal 105 is the battery power supply voltage.

When the second control signal 105 is at high level, the gate charge discharging circuit 108 is in the conductive state. Therefore, a gate charge of the output MOS transistor 109 is discharged via the gate resistance 107 and the gate charge discharging circuit 108. Here, the output MOS transistor 109 is made to be in the non-conductive state, and thus, an inductive element of the load 112 generates the negative surge voltage. Here, because a second overvoltage protection circuit 214 is set to be at a clamping voltage which is higher than the voltage at a first overvoltage protection circuit (the circuit includes the first dynamic clamping circuit 111 and the first switch 110), the second diode 117 is in the non-conductive state. Therefore, the gate of the output MOS transistor 109 is disconnected from the second dynamic clamping circuit 114. On the other hand, when a potential difference between a gate voltage of the first switch 110 and the gate voltage of the output MOS transistor 109 becomes larger than a threshold voltage of the first switch 110, the first switch 110 is made to be in the conductive state. When, after that, the gate voltage of the output MOS transistor 109 further drops and the potential difference across the first dynamic clamping circuit 111 becomes equal to or larger than a breakdown voltage of the first dynamic clamping circuit 111, a dynamic clamping voltage is generated across the first dynamic clamping circuit 111. Further, the output MOS transistor 109 is made to be in the conductive state. Accordingly, the voltage between the drain and the gate of the output MOS transistor 109 is controlled by a first dynamic clamping voltage. Further, the voltage between the drain and the source of the output MOS transistor 109 is controlled by a voltage which is the sum of the first dynamic clamping voltage and a threshold voltage of the output MOS transistor 109.

Next, operation in the dump surge mode will be described. A dump surge voltage (a first surge voltage) is applied to the first power supply line 101a, and the voltage at the first power supply line 101a is raised. In this case, the gate voltage of the first switch 110 is the ground potential and the output terminal 106 is at a positive voltage, and thus, the first switch 110 is in the non-conductive state. In other words, the gate of the output MOS transistor 109 and the first power supply line 101a are disconnected. Therefore, the gate voltage of the output MOS transistor 109 is not affected by voltage fluctuations of the first power supply line 101a. More specifically, the output MOS transistor 109 is in the non-conductive state when the second control signal 105 is at high level.

In this way, the output MOS transistor 109 is in the non-conductive state, and the voltage between the source and the drain is the dump surge voltage. Here, because the breakdown voltage between the drain and the gate and the breakdown voltage between the drain and the source of the output MOS transistor 109 are generally designed so as to be higher than the dump surge voltage, the output MOS transistor 109 is not destroyed by the dump surge.

As described in the above, in the power supply control circuit 204, by making the first switch 110 be in the conductive state according to change in the output terminal 106 in the negative voltage surge mode, the first dynamic clamping circuit 111 is operated to protect the output MOS transistor 109 from the negative surge voltage. In the conductive mode and the dump surge mode, because the output terminal 106 does not generate a negative voltage, the first switch 110 is in the non-conductive state and the first dynamic clamping circuit 111 is inoperative.

Next, operation in relation to a positive spike surge mode will be described. A positive spike surge voltage (a second surge voltage) which is higher than the dump surge is applied to the first power supply terminal 101, and the voltage at the first power supply line 101a is raised. Here, the state of the first overvoltage protection circuit (the circuit includes the first dynamic clamping circuit 111 and the first switch 110) is the same as that in the dump surge mode. With regard to the second overvoltage protection circuit 214, when the voltage at the first power supply terminal 101 is higher than the breakdown voltage of the second dynamic clamping circuit 114, the second diode 117 is made to be in the conductive state. When the voltage at the first power supply terminal 101 becomes higher than the sum of the breakdown voltage of the second dynamic clamping circuit 114 and a forward voltage of the second diode 117, the dynamic clamping voltage is generated across the second dynamic clamping circuit 114 and the second diode 117. Accordingly, the voltage between the drain and the source of the output MOS transistor 109 is controlled by the sum of the breakdown voltage of the second dynamic clamping circuit 114, the forward voltage of the second diode 117, and the threshold voltage of the output MOS transistor 109.

As described in the above, in the power supply control circuits 201 to 204 according to the present invention, the second overvoltage protection circuit is operative in relation to a positive spike surge voltage which is higher than a dump surge voltage but has a smaller energy, but the second overvoltage protection circuit is inoperative in relation to a dump surge (having a large energy). As described in the above, the power supply control circuits 201 to 204 according to the present invention can protect the output transistor from an overvoltage in relation to a negative surge voltage generated at the output terminal, a dump surge generated at the first power supply terminal, and a positive spike surge voltage which is higher than the dump surge voltage generated at the first power supply terminal but has a smaller energy. Therefore, the power supply control circuit which gives more efficient protection in relation to a positive spike surge voltage can be provided.

Although, in the above power supply control circuits 201 to 204, a MOSFET is used as an output transistor (power semiconductor device), an insulated gate bipolar transistor (IGBT) may also be used. Further, the pull-down device 115 is not limited to a depletion MOS transistor but may be a resistance.

Although the invention has been described above in connection with several preferred embodiments thereof, it will be appreciated by those skilled in the art that those embodiments are provided solely for illustrating the invention, and should not be relied upon to construe the appended claims in a limiting sense.

What is claimed is:

1. A power supply control circuit, comprising:
    an output transistor coupled between a power supply line and an output terminal to be coupled to a load;
    a first overvoltage protection circuit including a first clamping circuit and a first switch, the first clamping circuit and the first switch being coupled in series between the power supply line and a control terminal of the output transistor, the first switch coupling between the first clamping circuit and the control terminal of the output transistor in relation to a back electromotive voltage from the load and disconnecting between the first clamping circuit and the control terminal of the output transistor in relation to both a first surge voltage and a second surge voltage applied to the power supply line, the second surge voltage being greater than the first surge voltage; and
    a second overvoltage protection circuit including a second clamping circuit, a second switch and a pull-down device, the second clamping circuit and the second switch being coupled in series between the power supply line and the control terminal of the output transistor, the second switch coupling between the second clamping circuit being and the control terminal of the output transistor in relation to the second surge voltage, and the pull-down device maintaining the second switch inoperative in relation to both the back electromotive voltage from the load and the first surge voltage.

2. A power supply control circuit according to claim 1, wherein a breakdown voltage range of the output transistor is configured to be greater than the first surge voltage and less than the second surge voltage.

3. The power supply control circuit according to claim 1, wherein the second clamping circuit is coupled to the power supply line via the first clamping circuit.

4. The power supply control circuit according to claim 1, further comprising an additional diode coupled between the second switch and the second clamping circuit.

5. The power supply-control circuit according to claim 1, wherein the first switch includes a transistor including a gate terminal supplied with a reference voltage, a substrate bias terminal coupled to the output terminal, a drain terminal coupled to the first clamping circuit, and a source terminal coupled to the control terminal of the output transistor.

6. The power supply control circuit according to claim 1, wherein the first clamping circuit includes a diode including a cathode coupled to the power supply line, and an anode coupled to the first switch.

7. The power supply control circuit according to claim 1, wherein the first clamping circuit includes a plurality of Zener diodes connected in series to one another.

8. The power supply control circuit according to claim 1, wherein the pull-down device comprises a resistive element coupled between a control terminal of the second switch and the output terminal.

9. The power supply control circuit according to claim 8, wherein the resistive element comprises a depletion MOS (metal-oxide semiconductor) transistor.

10. The power supply control circuit according to claim 8, wherein the resistive element comprises a resistance.

11. The power supply control circuit according to claim 8, wherein the second clamping circuit includes a diode coupled to the power supply line, and an anode coupled to the second switch.

12. The power supply control circuit according to claim 11, wherein the diode comprises a plurality of Zener diodes connected in series to one another.

13. The power supply control circuit according to claim 8, wherein the second clamping circuit includes a diode including a cathode coupled to anode between the first clamping circuit and the first switch, and an anode coupled to the second switch.

14. The power supply control circuit according to claim 13, wherein the diode comprises a plurality of Zener diodes connected in series to one another.

15. The power supply control circuit according to claim 1, wherein the first overvoltage protection circuit is operative in relation to the back electromotive voltage and is inoperative in relation to the first surge voltage, while the second overvoltage protection circuit is operative in relation to the second surge voltage that is greater than the first surge voltage.

16. The power supply control circuit according to claim 1, wherein the first overvoltage protection circuit and the second overvoltage protection circuit turn on the output transistor to protect the output transistor from overvoltages in relation to the back electromotive voltage from the load and the second surge voltage comprising a positive spike surge voltage applied to the power supply line.

17. A power supply control circuit, comprising:
an output transistor coupled between a power supply line and an output terminal to be coupled to a load;
a first overvoltage protection circuit including a first clamping circuit and a first switch, the first clamping circuit and the first switch being coupled in series between the power supply line and a control terminal of the output transistor, the first switch including a transistor which includes a gate terminal supplied with a reference voltage, a substrate bias terminal coupled to the output terminal, a drain terminal coupled to the first clamping circuit and a source terminal coupled to the control terminal of the output transistor; and
a second overvoltage protection circuit including a second clamping circuit, second switch and a pull-down device, the second clamping circuit and the second switch being coupled in series between the power supply line and the control terminal of the output transistor, the pull-down device being coupled between a gate terminal of the second switch and the output terminal,
wherein the first clamping circuit has a first breakdown voltage, the second clamping circuit has a second breakdown voltage greater than the first breakdown voltage,
the first switch couples between the first clamping circuit and the control terminal of the output transistor in relation to a back electromotive voltage from the load and disconnects between the first clamping circuit and the control terminal of the output transistor in relation to both of the first surge voltage and the second surge voltage, and
the second switch couples between the second clamping circuit and the control terminal of the output transistor in relation to the second surge voltage, and the pull-down device maintaining the second switch inoperative in relation to the back electromotive voltage from the load or the first surge voltage.

18. The power supply control circuit according to claim 17, wherein the first overvoltage protection circuit and the second overvoltage protection circuit turn on the output transistor to protect the output transistor from overvoltages in relation to the back electromotive voltage from the load and the second surge voltage applied to the power supply line.

19. The power supply control circuit according to claim 17, wherein the second clamping circuit is coupled to the power supply line via the first clamping circuit.

20. The power supply control circuit according to claim 17, wherein the pull-down device comprises a resistive element coupled between the gate terminal of the second switch and the output terminal, the resistive element comprises at least one of a depletion MOS (metal-oxide semiconductor) transistor and a resistance.

* * * * *